United States Patent
Zhou et al.

(10) Patent No.: US 6,819,183 B1
(45) Date of Patent: Nov. 16, 2004

(54) TEMPERATURE AND PROCESS COMPENSATION OF MOSFET OPERATING IN SUB-THRESHOLD MODE

(75) Inventors: Jianjun Zhou, San Diego, CA (US); Xuejun (Andy) Zhang, San Diego, CA (US)

(73) Assignee: Qualcomm, Incorporated, San Diego, CA (US)

( * ) Notice: Subject to any disclaimer, the term of this patent is extended or adjusted under 35 U.S.C. 154(b) by 0 days.

(21) Appl. No.: 10/445,218

(22) Filed: May 23, 2003

(51) Int. Cl.[7] .................................................. H03F 3/04
(52) U.S. Cl. ..................................... 330/289; 330/298
(58) Field of Search ............................... 330/289, 296, 330/298, 207 P, 311, 288; 323/315, 316

(56) References Cited

U.S. PATENT DOCUMENTS

| | | | | |
|---|---|---|---|---|
| 5,177,453 A | * | 1/1993 | Russell et al. | 330/284 |
| 6,052,032 A | * | 4/2000 | Jarvinen | 330/289 |
| 6,677,823 B2 | * | 1/2004 | Terosky et al. | 330/289 |

* cited by examiner

*Primary Examiner*—Henry Choe
(74) *Attorney, Agent, or Firm*—Philip R. Wadsworth; Charles D. Brown; Nicholas J. Pauley

(57) ABSTRACT

Compensation for variations in temperature and manufacturing process of a MOSFET operating in its sub-threshold mode. The compensation may include circuitry containing at least a second MOSFET that may also operate in its sub-threshold mode. The operational characteristics of the second MOSFET may be closely matched to those of the first MOSFET, and the second MOSFET may be contained on the same substrate.

21 Claims, 4 Drawing Sheets

TEMPERATURE AND PROCESS COMPENSATION OF MOSFET OPERATING IN SUB-THRESHOLD MODE

BACKGROUND

1. Field

This application relates to MOSFET circuits, exponential circuits and CDMA communication systems.

2. Background

CDMA communication systems typically include one or more base stations for communicating with various subscriber stations, such as mobile cell phones and the like. Each base station often receives a signal from several subscriber stations at the same time.

In order to minimize interference between these signals, the power level of the transmitted signal from each subscriber station is often adjusted so that its received signal strength is approximately equal to the signal strength of the other signals at the same base station. This adjustment is usually made frequently because the received signal strength often varies as the distance between the subscriber station and the base station varies.

To accomplish this, the base station typically measures the received power level, compares it to a desired power level, and delivers a signal to the subscriber station indicating the needed power level. The subscriber station receives the signal and adjusts its output power level accordingly.

A variable gain amplifier is often used in the subscriber station to implement the needed adjustment in its output power level. It is often desirable that the subscriber station output power level be adjusted exponentially or, as it is known in the art, "linear-in-dB". As a consequence, the gain signal, which adjusts the output power level or power gain of the variable gain amplifier linearly, needs to vary according to the exponent of the power level signal delivered from the base station.

The exponential computation can be implemented in the digital domain. One approach is to create and refer to a table in memory that maps a set of power level signals to the needed gain signal for each. Such a map, however, requires significant memory space.

An algorithm could instead be used in the digital domain. Such an algorithm, however, would require programming, memory for the program and its operation, and processor time.

Whether using a map or an algorithm, a further problem with making the computation in the digital domain is that a digital to analog converter ("DAC") is often required to convert the digital output into the analog signal needed to control the variable gain amplifier. The exponential relationship between the power level signal and the need amplifier gain often requires the same incremental change in the power level signal to generate progressively smaller-incremental changes in the output power level at the lower levels of the power level signal. To insure that these very small incremental changes are accurate, a high resolution DAC is often needed, which can be expensive.

MOSFETs are also known to provide an exponential function when operated in their sub-threshold mode (also known as their "weak inversion" mode). Operation in the sub-threshold mode means that the range of voltages delivered to the gate of the MOSFET is below the threshold voltage of the MOSFET needed to fully turn on the MOSFET. However, this exponential function is known to vary widely as a function of the temperature of the MOSFET and as a function of structural variations that occur during the manufacture of the MOSFET. As a result, MOSFETs have not been considered to be good candidates for accurately performing the exponential function in a CDMA subscriber station.

SUMMARY

One aspect is an amplifier that may include a gain control circuit having an input and a first MOSFET configured to operate in a sub-threshold mode to generate a gain control signal that is an exponential function of a signal applied to the input.

The operation of the first MOSFET may be affected by variation in its temperature or physical structure.

The amplifier may also include a variable gain amplifier having a gain that is controlled by the gain control signal.

The amplifier may also include a compensation circuit having a second MOSFET configured to operate in a sub-threshold mode and to compensate for the effect on the first MOSFET of variation in its temperature or physical structure.

Another aspect is an amplifier that may include means having an input and a first MOSFET for operating in a sub-threshold mode and for generating a gain control signal that is an exponential function of a signal applied to the input.

The operation of the first MOSFET may be affected by variation in its temperature or physical structure.

The amplifier may also include means for providing a gain that is controlled by the gain control signal.

The amplifier may also include means having a second MOSFET for operating in a sub-threshold mode and for compensating for the effect on the first MOSFET of variation in its temperature or physical structure.

Another aspect is a compensated exponential circuit that may include a circuit having an input and a first MOSFET configured to operate in a sub-threshold mode to generate a signal that is an exponential function of a signal applied to the input.

The operation of the first MOSFET may be affected by variation in its temperature or physical structure.

The circuit may also include a compensation circuit having a second MOSFET configured to operate in a sub-threshold mode and to compensate for the effect on the first MOSFET of variation in its temperature or physical structure.

The second MOSFET may have operational characteristics that are closely matched to the first MOSFET and may be located on the same substrate as the first MOSFET.

Another aspect is a compensated MOSFET circuit that may include a first circuit having a first MOSFET configured to operate in its sub-threshold mode, an input, and an output.

The circuit may also include a compensation circuit having a second MOSFET configured to operate in a sub-threshold mode and to compensate for the effect on the first MOSFET of variation in its temperature or physical structure.

Another aspect is a compensated MOSFET circuit that may include a first, second and third MOSFET.

All three MOSFETs may have closely matched operational characteristics, be co-located on the same substrate, and be configured to operate in their sub-threshold mode.

The circuit may also include a first variable resistor configured to communicate with the gate of the first MOS- FET and having a control input configured to communicate with the second MOSFET.

The circuit may also include a second variable resistor configured to communicate with the second and third MOSFETs and having a control input configured to communicate with the second MOSFET.

The circuit may also include a current mirror circuit configured to communicate with the second and the third MOSFETs.

Another aspect is a compensated MOSFET circuit that may include a first and second MOSFET.

Both may have closely matched operational characteristics, be co-located on the same substrate, and be configured to operate in their sub-threshold mode.

The circuit may also include a resistor configured to communicate with the gate of the first MOSFET and with the drain of the second MOSFET.

The circuit may also include a constant current circuit configured to communicate with the gate and drain of the second MOSFET.

It is to be understood that other embodiments will become readily apparent to those skilled in the art from the following detailed description, wherein only embodiments are shown and described by way of illustration. As will be realized, there are many other and different embodiments, and the details that are discussed are capable of modification in various other respects, all without departing from the spirit and scope of what is claimed in this patent application. Accordingly, the drawings and detailed description are to be regarded as illustrative in nature, not as restrictive.

BRIEF DESCRIPTION OF DRAWINGS

Aspects are illustrated in the accompanying drawings by way of example only, and not by way of limitation.

DETAILED DESCRIPTION

The detailed description set forth below in connection with the appended drawings is intended as a description of exemplary embodiments, and is not intended to represent the only embodiments that can be practiced. The term "exemplary" used in this description means "serving as an example, instance, or illustration," and should not necessarily be construed as preferred or advantageous over other embodiments. The detailed description includes specific details for the purpose of providing a thorough understanding. However, it will be apparent to those skilled in the art that these specific details are not all essential. In some instances, well-known structures and devices are shown in block diagram form to better illustrate certain concepts.

Figure 1:
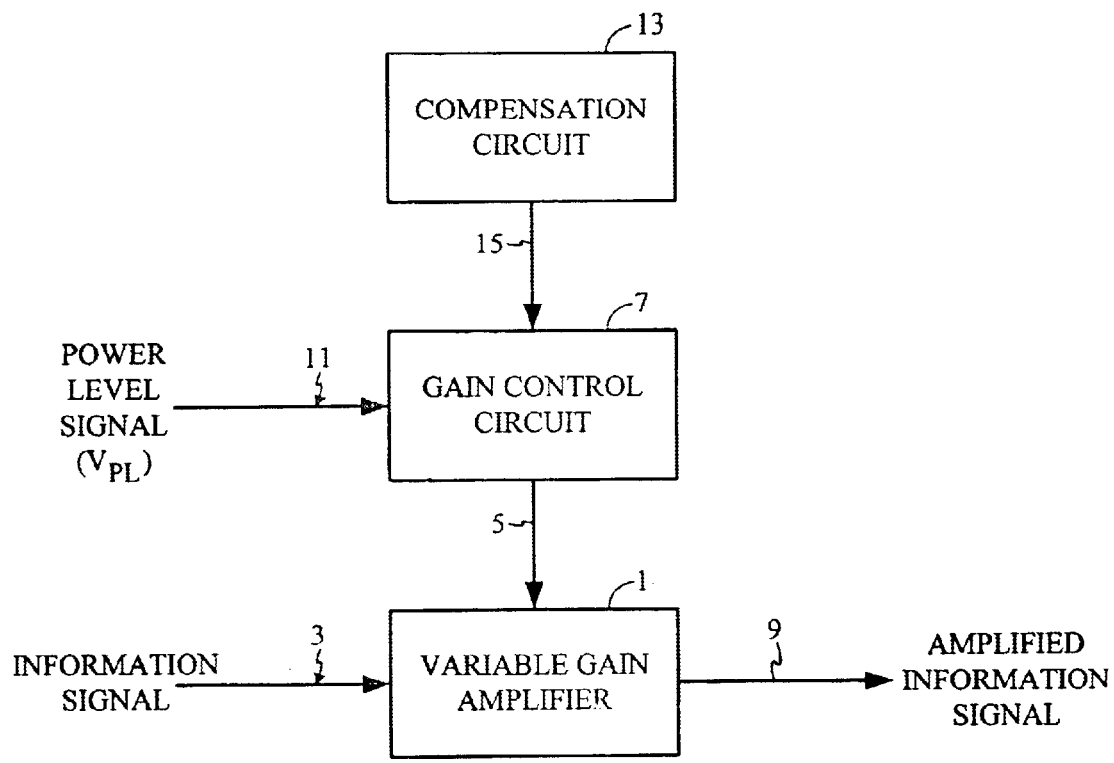
FIG. 1 is a block diagram of an amplifier for generating an amplified information signal in accordance with a power level signal.

FIG. 1 is a block diagram of an amplifier for generating an amplified information signal in accordance with a power level signal.

As shown in FIG. 1, an information signal may be directed into a variable gain amplifier 1 over a communication line 3. The gain of the variable gain amplifier 1 may be controlled by a gain signal delivered to a gain input 5 of the variable gain amplifier from a gain control circuit 7. The variable gain amplifier may include an output 9 that delivers the amplified information signal in accordance with the gain signal received at its gain input 5. The amplified information signal may be proportional to the information signal, multiplied by the level of the gain signal.

The information signal that may be processed by the variable gain amplifier 1 might be a base band signal containing audio, video, data, other types of information, or a mixture of these types of information. The information might instead be in digital format or in any other format. It might be information that a subscriber station such as a cell phone or the like wishes to transmit or information from another source, such as a computer.

The amplified information signal that may be delivered by the variable gain amplifier 1 may not be of the desired power level. It might also not be in the desired format. In either case, additional circuitry might be included, such as a modulator or power amplifier.

The gain control circuit 7 may convert the power level signal at its input 11 into the gain signal that is delivered to the variable gain amplifier 1 by causing the output at the communication line 5 to be an exponent of the signal at the communication line input 11. Of course, and as is well understood in the art, the exponential function may lack a certain degree of precision due to the frequent inability of electronic and computational systems to make precisely accurate computations and conversions.

The net effect of including the gain control circuit 7 in the system shown in FIG. 1 may be to insure that the power level of the amplified information signal that emanates from the variable gain amplifier 1 over a communication line 9 meets the requirement of the power level signal that is delivered to the gain control circuit 7 over the communication line 11.

The exponential function that may be implemented by the gain control circuit 7 may vary in its accuracy and precision for a variety of reasons, including variation in the temperature in which the gain control circuit 7 is operated. Variations in the physical structure of the components that are used in the gain control circuit 7 that are caused by variation in the manufacturing process can also contribute to these inaccuracies.

A compensation circuit 13 may be included that provides compensation to the gain control circuit 7 to minimize these inaccuracies. The compensation circuit 13 may be configured to only minimize inaccuracies caused by temperature variations, process variations, or variations caused by other factors. The compensation circuit 13 may also be configured to compensate for all of these variations, as well as any sub-combination of them. Although being shown as being in communication with the gain control function 7 over a communication line 15, it is to be understood that the compensation circuit 13 could instead or in addition be in communication with the variable gain amplifier 1 and/or with any other component in the system in which the block diagram as shown in FIG. 1 is used, while still providing a compensation function.

Figure 2:
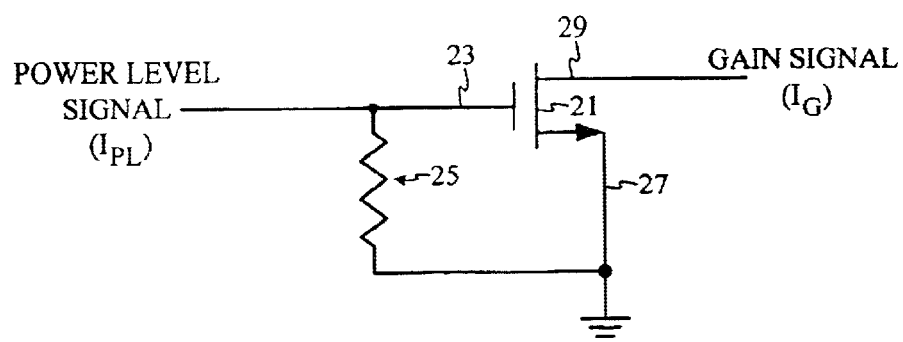
FIG. 2 is a diagram of a circuit that provides an exponential function.

FIG. 2 is a diagram of a circuit that provides an exponential function. FIG. 2 is one example of the gain control circuit 7 shown in FIG. 1.

As illustrated in FIG. 2, a MOSFET 21 has its gate 23 connected to the power level signal. This signal is illustrated in FIG. 2 as being symbolized by the variable $I_{PL}$ to indicate that the power level signal is represented by a current that is proportional to the desired power level. A resistor 25 is also connected to the power level signal and ground. The source of the MOSFET 21 is also connected to ground, and the drain 29 of the MOSFET 21 regulates the needed gain signal, represented in FIG. 2 as $I_G$ to indicate that the gain signal is a current that is proportional to the needed gain.

The level of the power level signal $I_{PL}$ may be set such that, even when at maximum, it does not develop a voltage at the gate of the MOSFET 21 that exceeds what is known as the threshold voltage of the MOSFET 21, namely the voltage at which the MOSFET 21 is turned on in its "strong inversion" mode. When operated in this mode, i.e., when the input voltage to the MOS is maintained below its threshold voltage, the MOSFET is said to be in its sub-threshold mode, also known as its "weak inversion" mode. In this mode, as is well known, the output current $I_G$ substantially adheres to the following equation:

$$I_G = I_O \exp \frac{I_{PL} R}{n V_T} \quad (1)$$

In equation (1), $I_O$ represents the saturation current of the MOSFET 21, meaning the current traveling from its drain through its source when its gate-to-source voltage is zero. $I_O$ is usually proportional to the size of MOSFET transistor. R is the value of the resistor 25; n is an empirically-determined, process-dependent coefficient; and $V_T$ is thermal voltage, generally equal to kT/q, with k being the Boltzmann's constant ($1.38 \times 10^{-23}$ JK$^{-1}$), T being the temperature in degrees Kelvin, and q being the charge of an electron ($1.602 \times 10^{-19}$ C).

Although the power level signal and gain signal are illustrated in FIG. 2 as being represented by a current, it is, of course, to be understood that these signals could be represented by a voltage or by any other type of approach. Appropriate adjustments in the circuitry, of course, would be needed and are readily within the skill of the ordinary artisan to provide. It should also be understood, of course, that the circuit in FIG. 2 is for illustrative purposes only, and that a broad variety of different circuits could also be used to provide the exponential function.

Although the variables $I_O$, n and $V_T$ appear to be constants, they are often subject to variation. $I_O$, n, and $V_T$, for example, can drift with temperature. The values of $I_O$ and n are also affected by variation in the physical structure of the MOSFET 21 which are caused by variation in the processes used to produce the MOSFET 21.

These variations, in turn, often cause the accuracy of the exponential function provided by the circuit in FIG. 2 to suffer. Indeed, the anticipated variations have been so great that it is believed that no one before has suggested using the MOSFET exponentiation circuit referred to in connection with the discussion in FIG. 2 to control a variable gain amplifier in a CDMA subscriber station.

Figure 3:
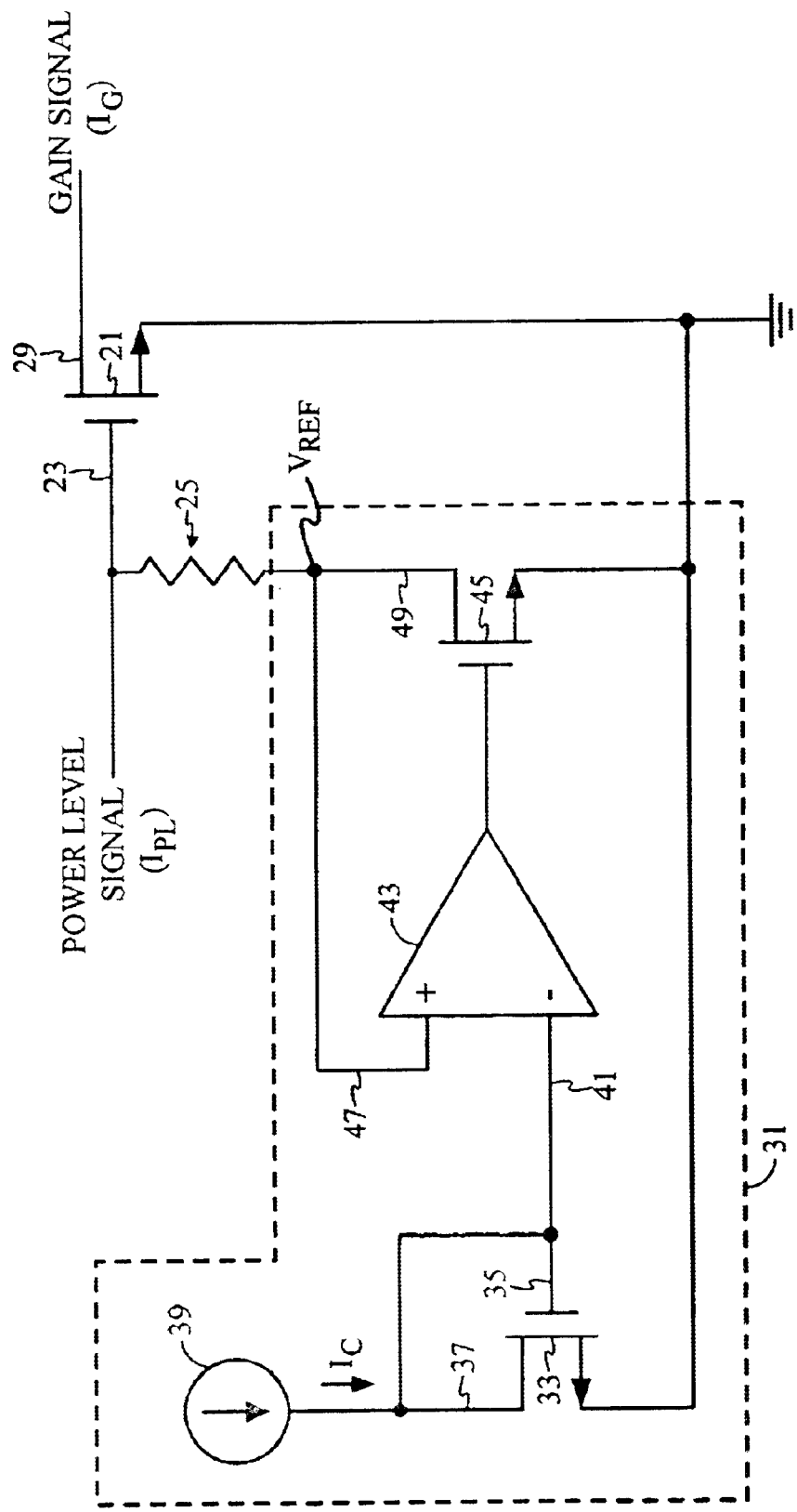
FIG. 3 is a diagram of a circuit that provides an exponential function connected to a circuit that provides compensation for variations in MOSFET saturation current.

FIG. 3 is a diagram of a circuit that provides an exponential function connected to a circuit that provides compensation for variations in the saturation current $I_O$. FIG. 3 is one example of the gain control circuit 7 and compensation circuit 13 in FIG. 1.

The MOSFET 21 and the resistor 25 that were illustrated in FIG. 2 are also present in FIG. 3. The power level signal $I_{PL}$ and the gain signal $I_G$ are also connected, respectively, to the gate 23 and drain 29 of the MOSFET 21. In FIG. 3, however, a compensation circuit 31 has been added. As will now be seen, the compensation circuit 31 compensates for variations in the linear term of equation (1) above, namely, in this instance, the saturation current $I_O$.

One component of the compensation circuit 31 is a MOSFET 33 configured as a diode with its gate 35 connected to its drain 37. A constant current source 39 is also connected to the drain 37 of the MOSFET 33. As is well known, a constant current source is a circuit that provides a substantially constant current. In one embodiment, the constant current source 39 is a bandgap circuit with constant bandgap current output. The constant current that flows from the constant current source 39 is designated in FIG. 3 as $I_C$.

The level of the constant current source 39 may be set such that the voltage on the gate 35 of the MOSFET 33 does not exceed the threshold voltage of the MOSFET 33 and, accordingly, that the MOSFET 33 operates in its sub-threshold or weak inversion mode.

The output from the MOSFET 33 may also be delivered to an inverting input 41 of a high gain amplifier 43. The output of the amplifier 43 may be delivered to a MOSFET 45 that is connected to the lower side of the resistor 25. The non-inverting input 47 of the high gain amplifier 43 may be connected to the drain 49 of the MOSFET.

As should now be apparent to those skilled in the art, the drain 49 of the MOSFET 45 will deliver a voltage, denominated as $V_{REF}$ in FIG. 3, which closely tracks the voltage on the drain 37 of the MOSFET 33.

The net effect of the compensation circuit 31 is to generate an offsetting voltage $V_{REF}$ that compensates for variation in the saturation current $I_O$ of MOSFET 21. The following mathematical analysis will demonstrate this to be the case.

The current that travels through the drain 37 of the MOSFET 33 is essentially equivalent to $I_C$, as very little of $I_C$ travels through the gate 35 of the MOSFET 33 or the inverting input 41 to the amplifier 43. Assuming that the MOSFET 33 is being operated in its sub-threshold mode, the following approximation will therefore be true:

$$I_C = I_O \exp \frac{V_{REF}}{n V_T} \quad (2)$$

$I_O$, n and $V_T$ have the same meaning as they had when discussed above in connection with FIG. 2 and equation (1), namely that $I_O$ is the saturation current of the MOSFET 33; n is the empirically-determined, process-dependent coefficient of the MOSFET 33; and $V_T$ is the thermal voltage.

The operational characteristics of the MOSFET 33 may be closely matched with those of the MOSFET 21. Similarly, the temperature of the MOSFET 33 may be maintained at approximately the same level as that of the MOSFET 21. These close matches may be facilitated by fabricating the MOSFETS 21 and 33 on the same substrate. When these close matches are maintained, the values of n and $V_T$ for the MOSFET 33 will be substantially the same as they are for the MOSFET 21. In addition, the following analysis is simplified by assuming that MOSFET 33 and MOSFET 21 have the same size and hence the same value of $I_O$.

Be gain signal $I_G$ from the MOSFET 21 may be expressed as follows:

$$I_G = I_O \exp\frac{I_{PL}R + V_{REF}}{nV_T} \quad (3)$$

In this equation, $I_{PL}$, $I_G$ and R have the meanings that they had as described above in connection with FIG. 2 and equation (1).

Using the distributed property of exponentiation, equation (3) may also be expressed as follows:

$$I_G = I_O \exp\frac{I_{PL}R}{nV_T}\exp\frac{V_{REF}}{nV_T} \quad (4)$$

In equation (4), the portion of the term on the right that consists of $$I_O \exp\frac{V_{REF}}{nV_T}$$

was established to equal to $I_C$ in equation (2). Making this substitution, the following relationship follows:

$$I_G = I_C \exp\frac{I_{PL}R}{nV_T} \quad (5)$$

As can be seen from equation (5), the gain signal $I_G$ is now independent of $I_O$. Thus, variations in $I_O$ due to variation in temperature or process will no longer substantially affect the gain signal $I_G$. The effect of these variations on the linear term $I_O$ has thus been compensated by the compensation circuit 31.

Of course, it should be understood that a broad variety of variations in the compensation circuit 31 can be made, without significantly departing from its compensation function. For example, MOSFET 33 and MOSFET 21 may have different sizes and equation (5) would then be modified by multiplying it by the size ratio between MOSFET 33 and MOSFET 21. However, the effect of variations in lo due to variation in temperature or process would still be compensated.

Figure 4:
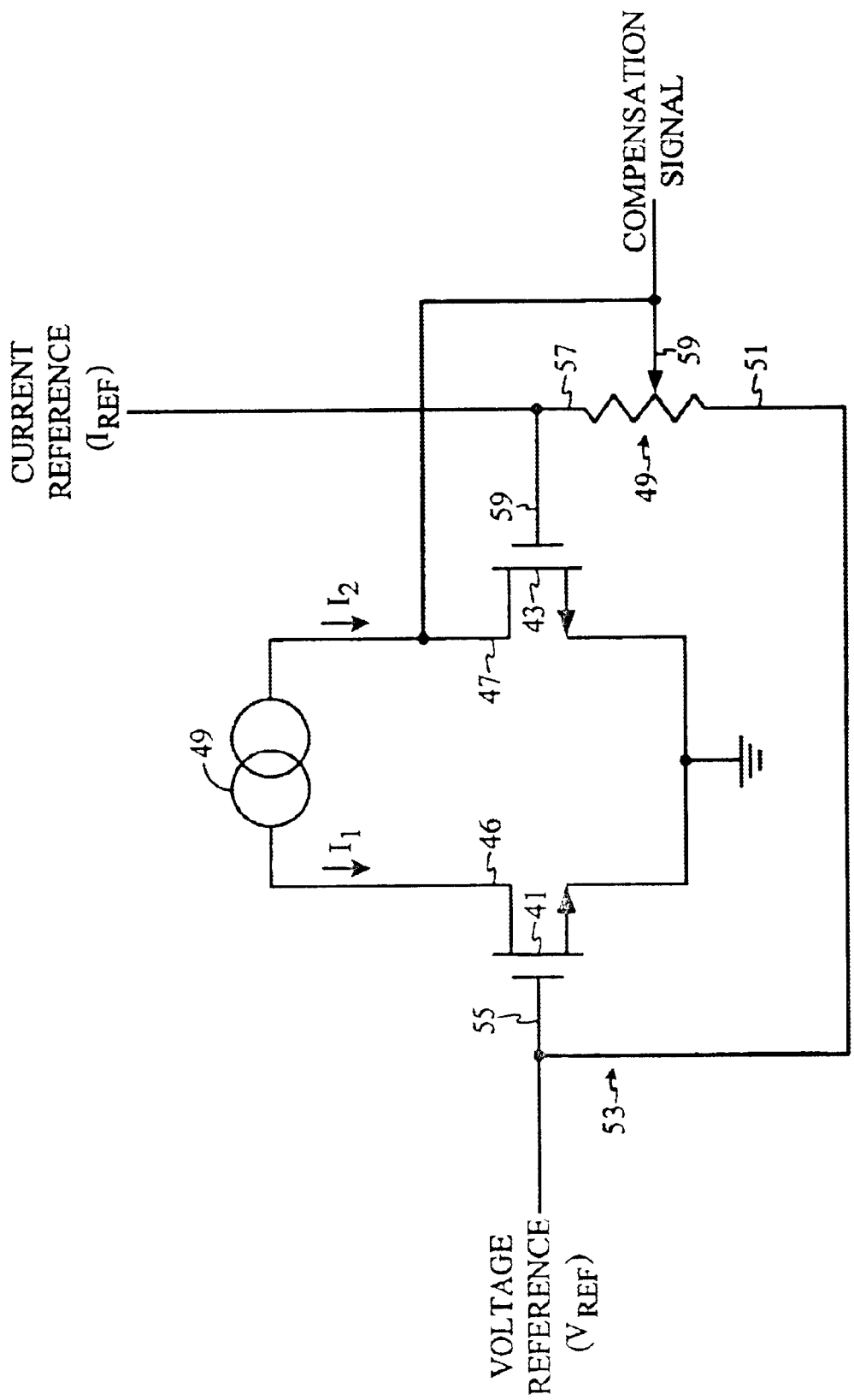
FIG. 4 is a diagram of a circuit that provides compensation for variations in a process dependent coefficient and thermal voltage.

FIG. 4 is a diagram of a circuit that provides compensation for variations in a process-dependent coefficient n and the thermal voltage $V_T$. FIG. 4 is another example of the compensation circuit 13 in FIG. 1.

As will become clear from the discussion below, one purpose of FIG. 4 is to generate a compensation signal that adjusts the value R of the resistor 25 shown in FIGS. 2 and 3 to compensate for variation in the process-dependent coefficient n and the thermal voltage $V_T$. The circuit includes a MOSFET 41 and a MOSFET 43 connected in a complementary configuration with their respective drains 46 and 47 connected to a current mirror circuit 49. As is well known, a current mirror circuit, such as the current mirror circuit 49, is a circuit that generates and delivers substantially-equal currents over two separate pathways.

The circuit of FIG. 4 also includes a variable resistor 49. One end 51 of the variable resistor is connected to the voltage reference $V_{REF}$. The voltage reference $V_{REF}$ is the same $V_{REF}$ that is shown in FIG. 3 and discussed above. The voltage reference $V_{REF}$ is also delivered to the gate 55 of the MOSFET 41.

The other end 57 of the variable resistor 49 is connected to a current reference $I_{REF}$. $I_{REF}$ is also delivered to the gate 59 of the MOSFET 43.

As is well known, a variable resistor, such as the variable resistor 49, is a device or circuit that provides a resistance that varies as a function of a control signal. In one embodiment, the variable resistor 49 is a MOSFET operating in its triode region. In the case of the variable resistor 49 shown in FIG. 4, the control signal 59 that is used to control the variable resistor 49 comes from the drain 47 of the MOSFET 43. The same signal that is used to control the resistance of the variable resistor 49 is delivered from the circuit in FIG. 4 as the needed compensation signal. (The use of this compensation signal will be discussed below in connection with FIG. 5.)

As explained above, the circuit in FIG. 3 compensates for variations in the saturation current $I_O$. This leaves variations in the process-dependent coefficient n and the thermal voltage $V_T$ uncompensated.

One approach for providing compensation for the process-dependent coefficient n and the thermal voltage $V_T$ is to make the value of the resistance R shown in FIGS. 2 and 3 as resistor 25 vary in proportion to changes in n and $V_T$. If this happened, the n and $V_T$ variations in R would cancel out the n and $V_T$ variations in the denominator of equation (1). This is one of the purposes of the circuit shown in FIG. 4.

The accomplishment of this can be mathematically demonstrated as follows:

The current $I_1$ that flows in the MOSFET 41 can be expressed as:

$$I_1 = kI_O \exp\frac{V_{REF}}{nV_T} \quad (6)$$

In this equation, k represents the size ratio between the MOSFET 41 and the MOSFET 43, $kI_O$ is the saturation current of MOSFET 41 and it is k times larger than that the $I_O$ of MOSFET 43 due to their size difference.

$I_2$ that flows in the MOSFET 43 can be expressed as:

$$I_2 = I_O \exp\frac{I_{REF}R + V_{REF}}{nV_T} \quad (7)$$

Using the distributed property of exponentiation, equation (7) may also be expressed as follows:

$$I_2 = I_O \exp\frac{V_{REF}}{nV_T}\exp\frac{I_{REF}R}{nV_T} \quad (8)$$

If the current mirror circuit 49 works properly, then $I_1$ would equal $I_2$. This means that:

$$kI_O \exp\frac{V_{REF}}{nV_T} = I_O \exp\frac{V_{REF}}{nV_T}\exp\frac{I_{REF}R}{nV_T} \quad (9)$$

Thus:

$$k = \exp\frac{I_{REF}R}{nV_T} \quad (10)$$

Solving this equation for R.

$$R = \frac{nV_T \ln K}{I_{REF}} \quad (11)$$

The negative feedback provided by the circuit shown in FIG. 4 will insure that the foregoing equation is always true by changing the value of R to make it true, notwithstanding variations in temperature or process.

The circuit in FIG. 4 now gives the variable resistor 49 (R) the needed proportional relationship to $nV_T$.

Figure 5:
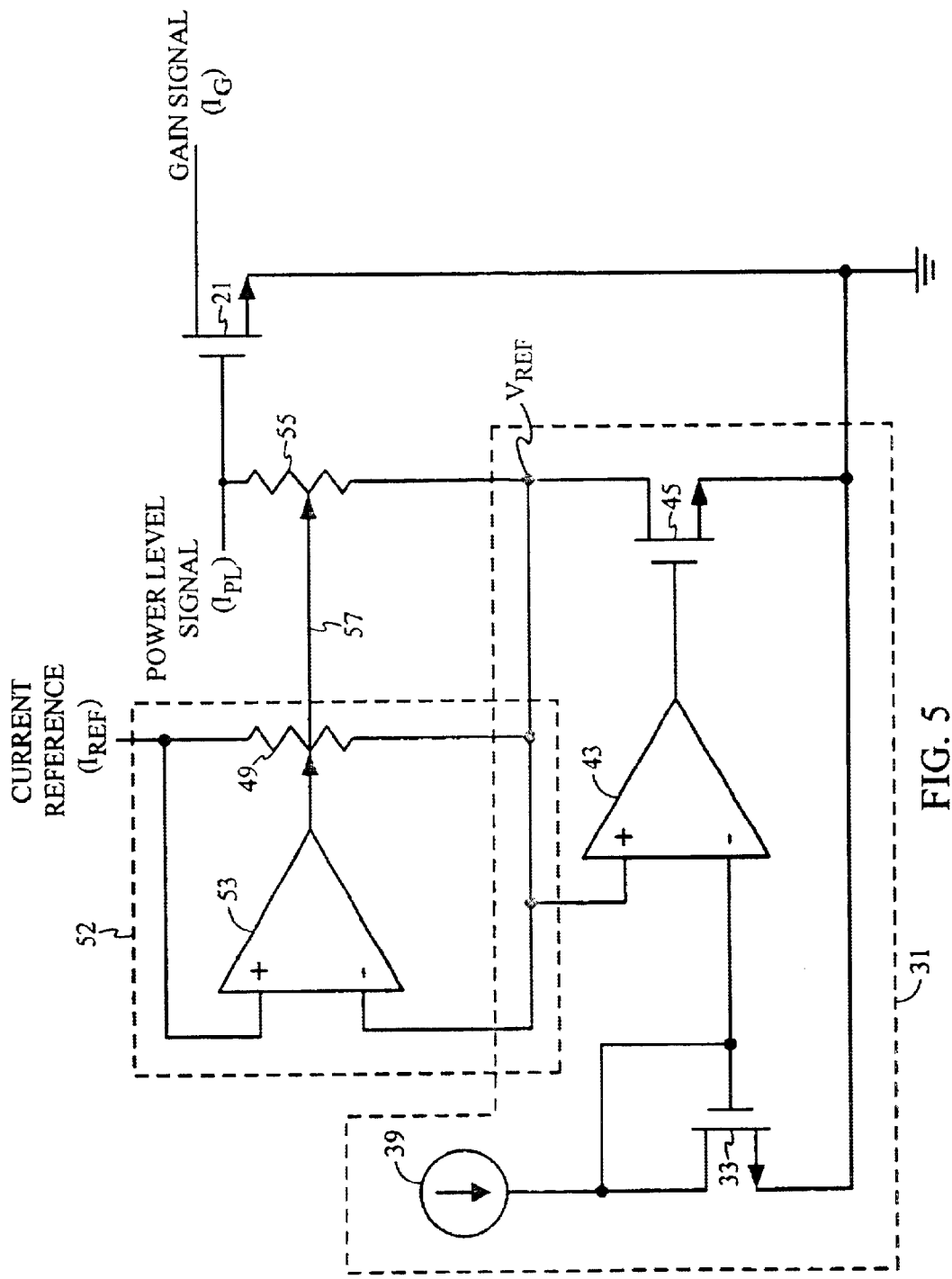
FIG. 5 is a diagram of a circuit that provides an exponential function connected to circuits that provide compensation for variations in saturation current, a process dependent coefficient and thermal voltage.

FIG. 5 is a diagram of a circuit that provides an exponential function connected to circuits that provide compensation for variations in saturation current, a process-dependent coefficient and thermal voltage. FIG. 5 also includes an illustration of one technique for injecting the compensation provided by the circuit in FIG. 4 into the gain control circuit shown in FIG. 2.

In essence, FIG. 5 represents a combination of the circuits shown in FIGS. 2-4 and thus another example of the amplifier shown in FIG. 1. The compensation circuit 31 shown in FIG. 3 may be present in the same form in FIG. 5.

The compensation circuit 51 may be essentially the same as the compensation circuit shown in FIG. 4. However, the current mirror 49 and the MOSFETS 41 and 43 in FIG. 4 have been illustrated in FIG. 5 in the simplified format of a high-gain offset amplifier 53. The variable resistor 49 that is shown in FIG. 4 may also be used in the configuration in FIG. 5. The compensation signal in FIG. 4 is shown in FIG. 5 as being delivered to a variable resistor 55. The variable resistor 55 is essentially the same as the resistor 25 shown in FIGS. 2 and 3, except that its resistance value varies depending upon the signal delivered to its control input 57.

The variable resistors 49 and 55 may be of the same type. The MOSFETs 21, 33, 41 and 43 may also be of the same type, having closely matched operational characteristics, co-located on the same substrate, and operated in the sub-threshold mode.

$I_{REF}$ may be set to be approximately equal to the maximum anticipated value of the power level signal $I_{PL}$.

When so configured, the gain signal $I_G$ becomes independent of variations in $I_O$, n and $V_T$.

This can be seen from the following mathematical analysis.

First, the following equation defines $I_G$ where R is the value of the variable resistors 49 and 55 and:

$$I_G = I_O \exp \frac{I_{PL}R + V_{REF}}{nV_T} \quad (12)$$

Equation (12) can be simplified by substituting $I_C$ for $$I_O \exp \frac{V_{REF}}{nV_T}$$

as set forth in equation (2) above, resulting in:

$$I_G = I_C \exp \frac{I_{PL}R}{nV_T} \quad (13)$$

The value of R from equation (11) above can now also be substituted, resulting in:

$$I_G = I_C \exp \frac{I_{PL} \ln K}{I_{REF}} \quad (14)$$

As can be seen from equation (14), $I_G$ is now independent of temperature and process variations in $I_O$, n and $V_T$. $I_C$, In K, and $I_{REF}$ in equation (14) are constants. Thus, the desired exponential relationship between $I_G$ and $I_{PL}$ is provided, independent of temperature and process variations.

The description that has now been provided of various embodiments should enable a person of ordinary skill in the art to make and use the technology that is set forth in the claims below. Various modifications to these embodiments will be readily apparent to those skilled in the art, and the general principles defined in this discussion may also be applied to other embodiments, without departing from the spirit or scope of the technology that is set forth in the claim below.

For example, the technology that is set forth in the claims below is not necessarily limited to CDMA cellular telephone systems. Nor is it necessarily limited to exponential circuits. In short, this application is not limited to the embodiments that have been shown and described, but it to be accorded the widest scope consistent with the principles and novel features that have been disclosed and set forth in the claims below.

What is claimed is:

1. An amplifier comprising:
   a) a gain control circuit having an input and a first MOSFET configured to operate in a sub-threshold mode to generate a gain control signal that is an exponential function of a signal applied to the input, the operation of the first MOSFET being affected by variation in its temperature or physical structure;
   b) a variable gain amplifier having a gain that is controlled by the gain control signal; and
   c) a compensation circuit having a second MOSFET configured to operate in a sub-threshold mode and to compensate for the effect on the first MOSFET of variation in its temperature or physical structure.

2. The amplifier of claim 1 wherein the operational characteristics of the second MOSFET are closely matched to those of the first MOSFET.

3. The amplifier of claim 2 wherein the second MOSFET is positioned such that it is subject to substantially the same variation in temperature as the first MOSFET.

4. The amplifier of claim 3 wherein the second MOSFET is located on the same substrate as the first MOSFET.

5. The amplifier of claim 2 wherein the effect on the operation of the first MOSFET because of variation in its temperature or physical structure includes a component that varies approximately linearly with the variation and wherein the compensation circuit is configured to compensate for this component.

6. The amplifier of claim 5 wherein the component that varies linearly includes the saturation current of the first MOSFET.

7. The amplifier of claim 5 wherein the compensation circuit includes an offsetting voltage circuit that is connected to the gain control circuit and that is configured to generate an offsetting voltage approximately as a linear function of the variation in the temperature or physical structure of the first MOSFET.

8. The amplifier of claim 7 wherein the offsetting voltage circuit includes a substantially constant source of reference current.

9. The amplifier of claim 8 wherein the constant source of reference current includes a bandgap circuit.

10. The amplifier of claim 2 wherein the effect on the operation of the first MOSFET because of variation in its temperature or physical structure includes a component that varies approximately exponentially with the variation and wherein the compensation circuit is configured to compensate for this component.

11. The amplifier of claim 10 wherein the component that varies exponentially includes the thermal voltage $V_T$.

12. The amplifier of claim 10 wherein the component that varies approximately exponentially includes an empirically-determined, process-dependent, coefficient n of the first MOSFET.

13. The amplifier of claim 10 wherein the gain control circuit includes a variable resistor having a resistance that is controlled by an input to the variable resistor and wherein the compensation circuit is connected to the input of the variable resistor.

14. The amplifier of claim 13 wherein the compensation circuit includes a third MOSFET configured to operate in its sub-threshold mode and a variable resistor and wherein the operational characteristics of the third MOSFET are closely matched to those of the first MOSFET.

15. The amplifier of claim 14 wherein the second and third MOSFETs are connected to a current mirror circuit.

16. The amplifier of claim 1 wherein the compensation circuit is configured to compensate for the effect on the first MOSFET of variation in both its temperature and physical structure.

17. An amplifier comprising:
a) means having an input and a first MOSFET for operating in a sub-threshold mode and for generating a gain control signal that is an exponential function of a signal applied to the input, the operation of the first MOSFET being affected by variation in its temperature or physical structure;
b) means for providing a gain that is controlled by the gain control signal; and
c) means having a second MOSFET for operating in a sub-threshold mode and for compensating for the effect on the first MOSFET of variation in its temperature or physical structure.

18. A compensated exponential circuit comprising:
a) a circuit having an input and a first MOSFET configured to operate in a sub-threshold mode to generate a signal that is an exponential function of a signal applied to the input, the operation of the first MOSFET being affected by variation in its temperature or physical structure;
b) a compensation circuit having a second MOSFET configured to operate in a sub-threshold mode and to compensate for the effect on the first MOSFET of variation in its temperature or physical structure, the second MOSFET having operational characteristics that are closely matched to the first MOSFET and being located on the same substrate as the first MOSFET.

19. A compensated MOSFET circuit comprising:
a) a first, second, and third MOSFET, all three MOSFETs having closely matched operational characteristics, co-located on the same substrate, and configured to operate in their sub-threshold mode;
b) a first variable resistor configured to communicate with the gate of the first MOSFET and having a control input configured to communicate with the second MOSFET;
c) a second variable resistor configured to communicate with the second and third MOSFETs and having a control input configured to communicate with the second MOSFET; and
d) a current mirror circuit configured to communicate with the second and the third MOSFETs.

20. The compensated MOSFET circuit of claim 19 wherein:
a) the second variable resistor is configured to communicate with the gates of the second and third MOSFETs;
b) the current mirror circuit is configured to communicate with the drains of the second and third MOSFETs; and
c) the range and control input levels of the first and second variable resistors are substantially the same.

21. An amplifier comprising:
d) a first MOSFET configured to operate in a sub-threshold mode and to provide amplification, the operation of the first MOSFET being affected by variation in its temperature and physical structure; and
e) a compensation circuit, said compensation circuit having a second, third and fourth MOSFET, each configured to operate in a sub-threshold mode, having operational characteristics closely matched to said first MOSFET, and being located in close proximity to said first MOSFET, wherein said second MOSFET forms part of an offsetting voltage circuit that is connected to said first MOSFET, and wherein said third and forth MOSFETS are connected to a current mirror and to said first MOSFET.

* * * * *